United States Patent [19]

Ross et al.

[11] Patent Number: 5,737,173
[45] Date of Patent: Apr. 7, 1998

[54] RAILROAD TRACK CIRCUIT VITAL RELAY CONTROL

[75] Inventors: Daniel T. Ross, Sunnyvale; Brian D. Holt, Alta Loma, both of Calif.; James E. Moe, Circle Pines, Minn.

[73] Assignee: Safetran Systems Corporation, Minneapolis, Minn.

[21] Appl. No.: 655,700

[22] Filed: Jun. 3, 1996

Related U.S. Application Data

[63] Continuation-in-part of Ser. No. 235,485, Apr. 29, 1994, abandoned.
[51] Int. Cl.⁶ ................................................. H03K 17/81
[52] U.S. Cl. ................................................. 361/160; 307/408
[58] Field of Search .............................. 361/182, 184, 361/185, 204, 160; 307/401, 407, 408, 411

[56] References Cited

U.S. PATENT DOCUMENTS

| | | |
|---|---|---|
| 3,819,933 | 6/1974 | Grundy ................................. 246/114 |
| 4,188,002 | 2/1980 | Gilcher . |
| 4,258,312 | 3/1981 | Gilcher . |
| 4,298,179 | 11/1981 | Gilcher . |
| 4,392,626 | 7/1983 | Pascoe ................................. 246/34 R |
| 4,535,959 | 8/1985 | Gilcher . |
| 4,652,776 | 3/1987 | George . |

Primary Examiner—Fritz Fleming
Attorney, Agent, or Firm—Dorn, McEachran Jambor & Keating

[57] ABSTRACT

A railroad vital relay control circuit has a first input for receiving a reference alternating current signal of a selected frequency and a second input for receiving a track alternating current signal having the selected frequency of the reference signal and a predetermined phase and magnitude relationship therewith. A magnetic core provides a logical AND function and has two input arms and an intermediate output arm. There is a winding on each of the input arms and a winding on the output arm. There are frequency tuned voltage limiting circuit elements connecting the first input and a first one of the magnetic core input windings and the second input and the second input winding of the magnetic core. The magnetic core has an output winding on the intermediate arm which is connected to a vital relay. The input windings on the magnetic core are connected to produce flux in the same direction in the output arm. In phase signals of the selected frequency at the magnetic core input windings provide sufficient flux in the output arm to induce a signal in the output winding to hold the vital relay in an operated position.

26 Claims, 6 Drawing Sheets

RAILROAD TRACK CIRCUIT VITAL RELAY CONTROL

This is a continuation-in-part of application Ser. No. 08/235,485, filed Apr. 29, 1994, now abandoned, in the names of Daniel T. Ross and Brian D. Holt.

THE FIELD OF THE INVENTION

The present invention relates to control circuits for vital relays which are used in railroad signaling and to control the operation of railroad crossing gates and warning lights. As is known in the art it is absolutely essential in the railroad industry that the relays controlling the operation of signals and crossing gate equipment be fail-safe. This mandates the use of what is termed a vital relay or track relay which only permits signal systems to pass trains and crossing gate and warning light systems to be in an off condition when the relay is operated. The relay will drop out of an operated position if a train is in the particular track block being controlled or if there is a fault on the system which prevents an accurate detection of the presence of a train.

Specifically, the present invention relates to a vital relay control circuit for use with either a railroad signal system or with a crossing gate and warning light control. The system is particularly designed for use with electrified rails, but can be used in those instances in which there is sufficient inductive coupling between a local power line and the track to provide a substantial level of the power frequency on the rails which could be disruptive of normal track frequency control signals.

THE PRIOR ART

U.S. Pat. No. 4,652,776 discloses a multipath magnetic core for use in controlling the operation of a vital relay in a railroad track circuit.

U.S. Pat. Nos. 4,188,002, 4,258,312, 4,298,179, and 4,535,959 all disclose various control circuits for vital relays of the general type disclosed herein.

SUMMARY OF THE INVENTION

The present invention relates to railroad track circuits for controlling the operation of a vital relay in either a railroad signal system or a crossing gate and warning light control system.

A primary purpose of the invention is a vital relay control circuit for use in track application having electrified rails or where there is an adjacent power line with sufficient inductive coupling to provide a substantial level of the power frequency on the rails.

Another purpose is a simply constructed reliable vital relay control circuit utilizing a phase comparator which compares the phase of a selected frequency on the track and a reference signal of the same selected frequency.

Another purpose is a vital relay control circuit utilizing a multiarm magnetic core as a logical AND gate for detecting an in phase condition between a reference signal and the track signal, with such in phase condition maintaining a vital relay in an operated position.

Another purpose is a vital relay control circuit as described in which the multiarm magnetic core has frequency tuned voltage limiting input circuits therefor.

Another purpose is a vital control circuit as described in which a second multiarm magnetic core between the vital relay and the output of the first magnetic core insures reliability of vital relay operation.

Another purpose is a vital relay track control circuit having a phase comparator which changes output voltage levels depending upon the occupancy condition of the track and a diode rectifier connected to the phase comparator output to enhance the ratio of the phase comparator output voltage levels to insure proper operation of the vital relay connected thereto.

Other purposes will appear in the ensuing specification, drawings and claims.

BRIEF DESCRIPTION OF THE DRAWINGS

The invention is illustrated diagrammatically in the following drawings wherein.

DESCRIPTION OF THE PREFERRED EMBODIMENT

U.S. Pat. No. 4,652,776 discloses a multiarm magnetic core which functions as an AND gate to control a vital relay. The present invention utilizes this type of magnetic core logical circuit and provides additional control coils and frequency tuning voltage limiting circuit components. Other types of phase comparators may also be used in the broadest aspects of the invention.

The present invention will be described in connection with a railroad signal system, but in its broadest context is usable to control a vital relay which is sensitive to the occupancy of a selected length of track for any purpose. The vital relay may control a railroad signal or it may control the crossing gates and warning lights associated with a selected length or block of track. What is important is the specific phase comparator control circuit for insuring that the vital relay is only in an operated condition when the track is unoccupied and there is no fault condition in either the control circuit or the track circuit.

Figure 1:
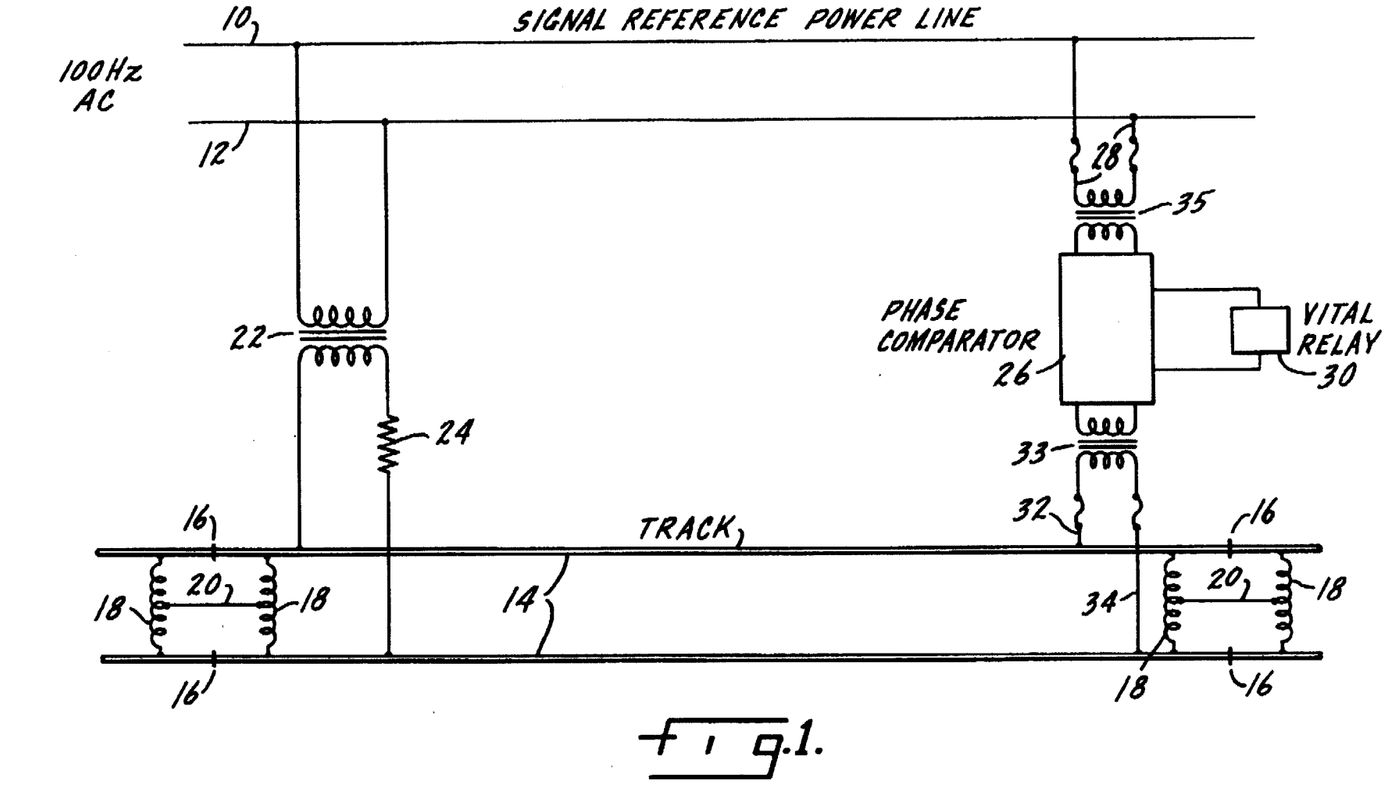
FIG. 1 is a diagrammatic illustration of a railroad track circuit illustrating the vital relay control circuit disclosed herein.

In FIG. 1, a signal reference power line has lines 10 and 12 which carry a 100 Hz AC signal. This is a conventional frequency for the use described. However, in some instances where the power frequency on the electrified rails is 25 Hz, the reference frequency may be 91.67 Hz. The particular frequency is not important. What is essential is that there be a signal reference power line. The railroad track is indicated at 14 and the selected track block or length of track is determined by insulated rail joints indicated at 16. In order to transfer electrical power for the rails from one block to another, each insulated joint is spanned by a pair of inductors 18 with an intermediate connection 20.

The reference signal from lines 10 and 12 is connected to the track through a transformer 22 and a resistor 24. The resistor is necessary in the circuit to limit current flow in the transformer secondary when the rails are shunted directly adjacent the feedpoint of the reference signal. In some applications resistor 24 may be replaced by a reactor or a resistor and reactor in series.

At the other end of the track block is a phase comparator 26 which is connected by a transformer 35 and fused lines 28 to the reference signal on power lines 10 and 12. A transformer 33 is connected by fused lines 32 and 34 to the track and is desirable to step up the track voltage to a level suitable for the phase comparator input. A vital relay is indicated at 30 and is connected to the phase comparator as shown in more detail in FIGS. 2, 3, 4, 5 and 6. The fuse connections are necessary in the event there is a serious unbalance between the voltage applied to the rails from the traction current or any other source. Such an imbalance could overload the phase comparator and render the vital relay ineffective to perform its essential function.

Figure 2:
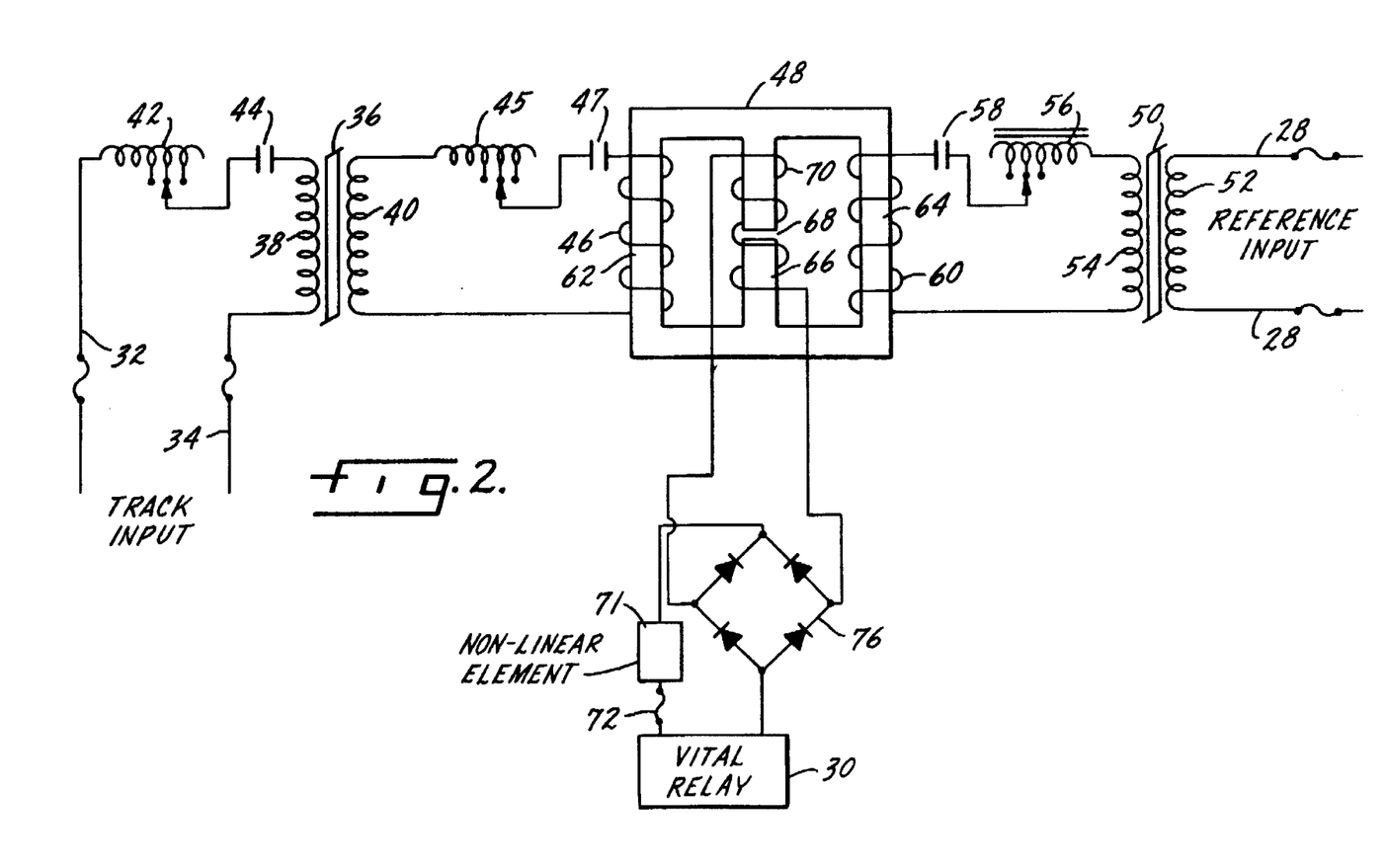
FIG. 2 is a schematic of the phase comparator of FIG. 1.

In FIG. 2, the phase comparator has a track input and a reference input. The track input is on lines 32 and 34 which are connected through a tuned circuit including a tapped inductor 42 and a capacitor 44 to a saturable transformer 36 having a primary winding 38 and a secondary winding 40. The secondary winding of the saturable transformer 36 is connected to an input coil 46 of the magnetic core logic gate 48. This connection includes a tuned circuit including a tapped inductor 45 and a capacitor 47. The reference signal input from power lines 10 and 12 is connected through lines 28 to a saturable transformer 50 having a primary winding 52 and a secondary winding 54. The secondary winding 54 is connected through a variable inductor 56 and a capacitor 58 to another input winding 60 of the magnetic core logic gate 48.

Logic gate 48, in the form shown, has three arms, input arms 62 and 64, and an intermediate output arm 66 which may have an air gap 68. There is an output winding 70 on intermediate or output arm 66.

Output winding 70 is connected to a full wave bridge rectifier 76. Rectifier 76 is connected through a non-linear element 71, such as a zener diode or varistor, to the vital relay 30. The non-linear element 71 is not necessary in every application. The non-linear element may also be connected between output winding 70 and rectifier 76. When a varistor or other non-linear element is used, it is inherently not fail-safe in a short circuit failure mode. Therefore, a fuse 72 or other protection device must be hooked in series with the non-linear element such that the increase in current due to a fail-short in the non-linear element will cause the fuse or other protection device to open, creating a safe failure.

Considering the magnetic core logic gate 48, when a signal is applied to coil 46, the flux produced thereby will pass through the magnetic circuit of the entire laminated core. The flux will be divided and a portion will flow through center arm 66 and a portion through input arm 64. The amount of flux which flows through each path is determined by the reluctance of the center arm, which may have a reduced cross section to increase its inherent reluctance and as shown may have an air gap 68. The same is true with the flux generated by a signal passing through winding 60. Again, the flux will be divided between arm 66 and arm 62. When signals of the same frequency and phase are applied to windings 46 and 60, and when these windings are arranged to produce flux in the same direction in center arm 66, all of the flux induced through the signals in windings 46 and 60 will flow through the center arm. The reluctance of this arm, in part controlled by air gap 68, will determine the strength of signal induced in output winding 70. Thus, when there are in phase signals of like frequency applied to the input windings, there will be an output signal induced in winding 70 and this signal will be applied to the inputs of bridge rectifier 76. The output of the bridge rectifier will provide sufficient voltage to hold vital relay 30 in an operated position.

Input signals of like phase and frequency will be applied to the coils 46 and 60 of the magnetic core logic circuit 48 when the track block that is controlled by vital relay 30 is unoccupied. In that condition the reference signal from the power line which is applied to the track will be applied to one winding of the logic gate and the signal from the track which will be of the same frequency and phase will be applied to the other input of gate 48. These two inputs will provide an output signal to the vital relay to maintain it in an operated position. In the event the track block is occupied or there is a fault condition at some point on the track or in the control circuit, there will be no signal, or a very low level signal, applied to input winding 46 with the result that there will not be sufficient flux passing through intermediate arm 66 to induce a signal in winding 70 to operate the vital relay.

The three-limb magnetic core logic gate 48 has a non-linear input to output characteristic which is desirable to sharpen the response to a condition in which the track block is occupied or there is a fault condition in the track or control circuit. This non-linear response is enhanced by the use of non-linear element 71 in circuit between the output arm of the logic gate and the vital relay.

It is necessary to protect the logic gate from power surges and it is also necessary to insure that only signals of the selected frequency are applied to the gate. Thus, the gate input circuits, both from the reference input and from the track input have, in the FIG. 2 embodiment, saturable transformers and tuned circuits. The saturable transformer limits the voltage applied to the logic gate and the tuned circuit insures that only a signal of the selected frequency is applied to the input coils. As indicated above, there are fuses in the track input to protect the phase comparator from power surges which might result due to an imbalance between the reference signal voltage applied to the rails. Similarly, there are fuses in the reference input lines to protect the phase comparator when a signal at traction frequency is applied to the reference input.

Figure 3:
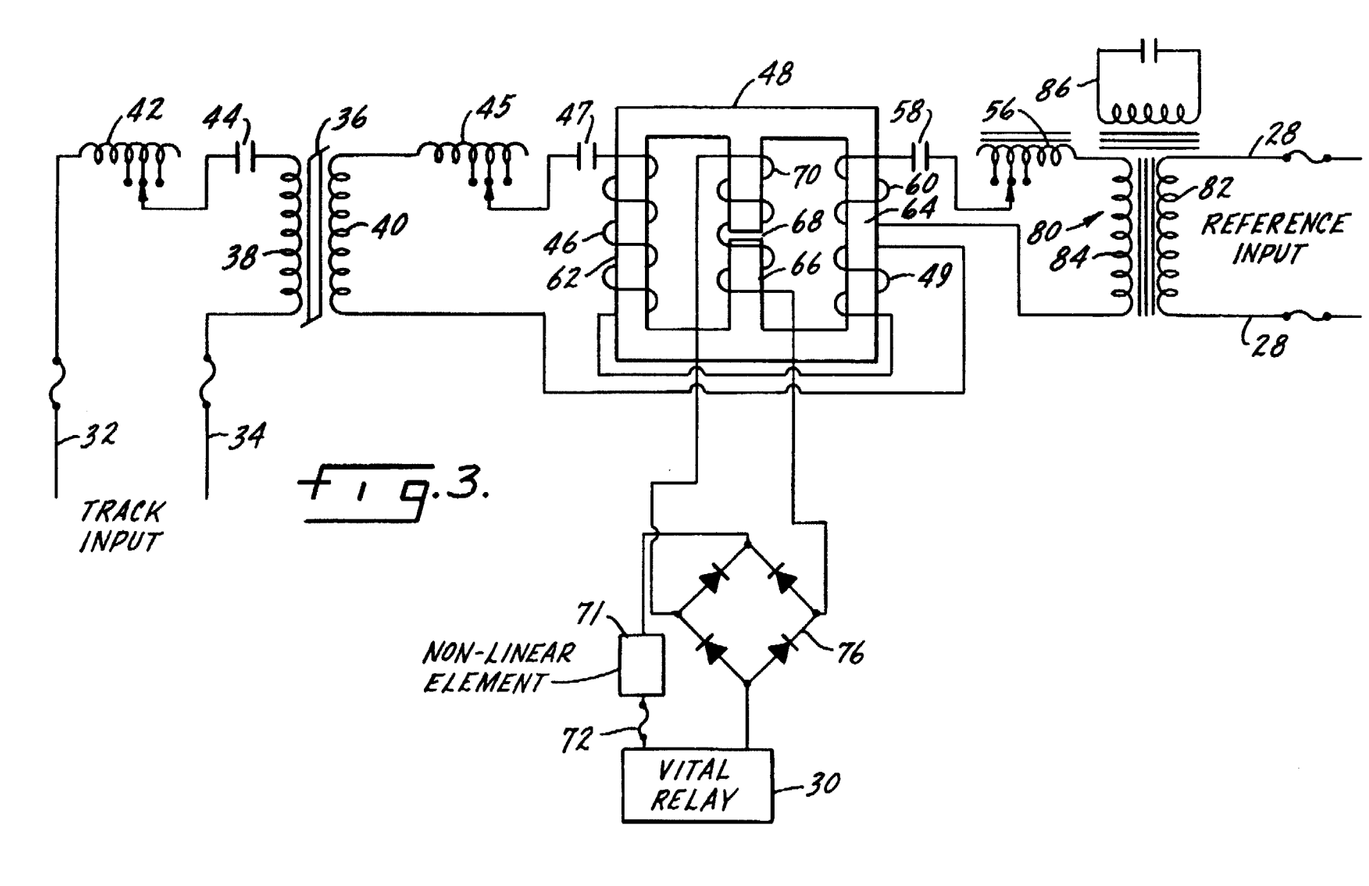
FIG. 3 is a schematic illustrating a second embodiment of phase comparator.

The FIG. 3 embodiment is the same as illustrated in FIG. 2, except for the components used to frequency tune and limit the reference voltage applied to the magnetic core logic gate and for the inclusion of a control coil 49 on the reference input arm. Like numbers have been given to the same parts. In the FIG. 3 embodiment, the reference input circuit includes a ferroresonant transformer 80 made up of a primary coil 82 and a secondary coil 84 and a resonant tuned circuit 86. A ferroresonant transformer is advantageous in that the secondary side of the transformer is excited in part by the resonant circuit so as to provide a generally constant voltage on the transformer secondary regardless of voltage fluctuations on the transformer primary. The constant secondary voltage is due to the use of the ferroresonant transformers resonant circuit. Thus, the ferroresonant transformer provides the required frequency selection and voltage limitation necessary for the input to the magnetic core logic gate 48. Although the FIG. 3 embodiment includes a tuned circuit between secondary coil 84 and input coil 60, this may not be necessary in every application.

The input coil 46 from the track input is connected to a control coil 49 on the same arm of the logic gate as reference input winding 60.

The control coil 49 is desirable to sharpen the response of the logic gate under conditions when the track block is occupied. Specifically, when the track block is occupied that creates an effective short across coil 46 which has the effect of reducing the reluctance of limb 62 of gate 48. This forces the flux generated by reference winding 60 on limb 64 through output limb 66, producing an effect opposite to that desired when the track block is occupied. The cross coupled control winding 49 reduces the reluctance in limb 64 concurrent with the reduction in reluctance of limb 62 caused by a short across coil 46. Thus, the control winding insures the sharp non-linear input/output response of the logic gate to an occupied track block.

Figure 4:
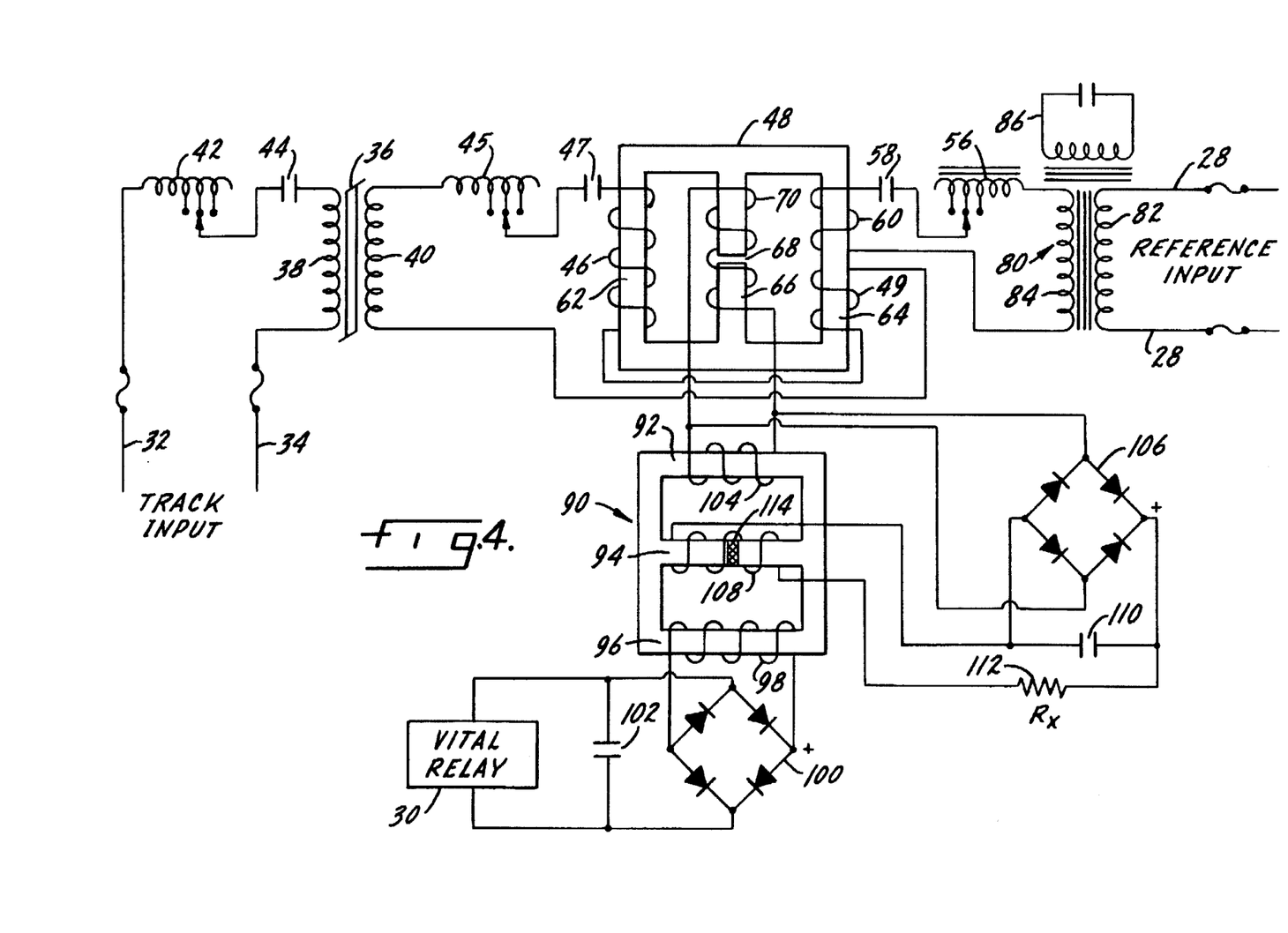
FIG. 4 is a schematic illustrating a third embodiment of the invention.

The FIG. 4 embodiment is similar to FIG. 3 and like elements have been given the same number. Essentially, the non-linear element 71 of FIG. 3 has been replaced by a second magnetic core logic gate indicated generally at 90. Logic gate 90 includes a first input arm 92, a second input arm 94, which is the center arm of the logic gate, and a third arm 96 which is the output arm of the logic gate. Arm 96 has a coil 98 wound about it, which coil is connected by a full wave bridge rectifier 100 to the vital relay 30. A capacitor 102 may be connected between the output terminals of bridge rectifier 100.

Input arm 92 carries a coil 104 which is connected to the output coil 70 of gate 48. The output of coil 70 of gate 48 is also connected to a full wave bridge rectifier 106 whose output terminals are connected to the second input coil 108 mounted on the intermediate arm 94 of logic gate 90. A capacitor 110 may be connected across the output terminals of full wave bridge rectifier 106 and a resistor 112 is connected in circuit with coil 108 as a means for trimming the non-linear circuit of gate 90 to provide standardized voltage levels when the unit is used in the field. The intermediate arm 94 of logic gate 90 includes a permanent magnet 114 whose function will be described.

When there is a voltage induced in coil 70, indicating that the track circuit is clear, and for purposes of illustration, assume such to be 45 volts AC, this voltage will be applied to coil 104, one of the input coils of logic gate 90. The same magnitude of voltage, but a DC voltage, will be applied from bridge rectifier 106 to the other input coil 108 of logic gate 90. Under such circumstances, the output voltage induced in coil 98 will be 15 volts AC which will be sufficient to pick up the vital relay 30 and maintain it in an operated condition.

Because the output of coil 70 never truly goes to zero, when the track is shunted, the logic gate 90 is used to insure that the vital relay will drop out under any condition in which the voltage drops below a predetermined point. Due to hysteresis in the vital relay, the drop-away point is considerably lower than the pickup point. Thus, the non-linear element in the form of the logic gate 90 insures that the vital relay will drop out when the track is shunted or when some other condition may prevail in which the voltage induced in coil 70 is not zero, but is at some intermediate level.

Assuming that the track circuit is shunted by the presence of a train, and that the voltage from coil 70 has been reduced to 35 volts AC, this will apply 35 volts DC to coil 108, which will result in zero volts AC at output coil 98. This voltage obviously will not pick up the vital relay and since it is zero, will result in the vital relay being opened. The presence of the permanent magnetic on the center leg of logic gate 90 prevents any primary to secondary voltage transfer until the primary flux is neutralized by a DC voltage on the intermediate winding 108. That is the purpose of the permanent magnet as it cooperates with the bridge rectifier 106 to insure that there is only primary to secondary voltage transfer in logic gate 90 when there is a DC voltage on the center coil.

Although varistors may at times be satisfactory as a non-linear element in a track circuit as disclosed, there is a safety problem when and if the varistor should short, which is one of its possible failure modes. The logic gate 90 is a totally reliable, totally vital, circuit element. The permanent magnet and the magnetic characteristics of the core are considered to be most dependable and not prone to possible failure. In addition, the use of resistor 112 in the circuit to the center coil enables the voltage parameters of the track circuit to be set to any limits desired by the railroad.

It is necessary to limit the voltage applied to either winding of the magnetic core logic gate 48 to insure that the relay will function in a vital manner if the input signal to either winding is reduced. Otherwise it is possible that an uncontrolled increase in either the track signal voltage or the reference signal voltage could result in a sufficient flux level in the output winding to provide a signal which would exceed the threshold of the vital relay. The series tuned filters provide a similar function in eliminating any undesirable noise which could adversely affect the function of the vital relay.

The vital relay control circuits described heretofore may be for use with 2,000 ohm vital relays as such are commonly used in the railroad environment. The non-linear element 71 of FIG. 3 and the logic gate 90 of FIG. 4 both are effective to enhance the ratio between the voltage level at the output of gate 48 when the track is unoccupied and the voltage level at the output of gate 48 when the track is occupied. The gate 48 is a phase comparison device and in order for the difference between its output levels when the inputs are in phase and the inputs are out of phase to be sufficient to insure that the vital relay will only be operated when the track is unoccupied, it is necessary to have a non-linear element connected between the phase comparator and the vital relay. In the FIG. 3 embodiment, the non-linear element 71 performs this function and in the FIG. 4 embodiment this function is performed by gate 90.

Figure 5:
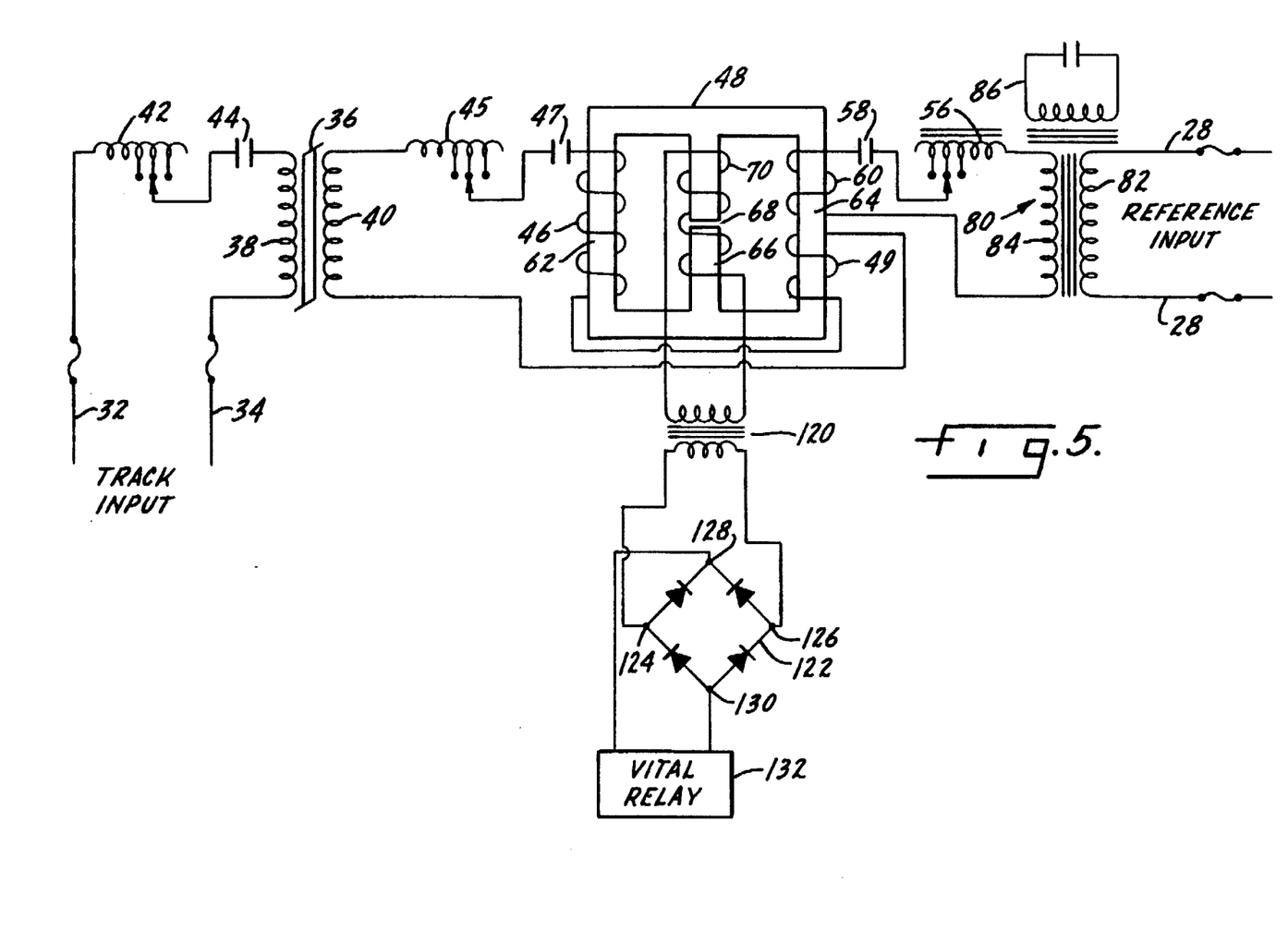
FIG. 5 is a schematic illustrating a fourth embodiment of the invention.
Figures 6, 7A, 7B:
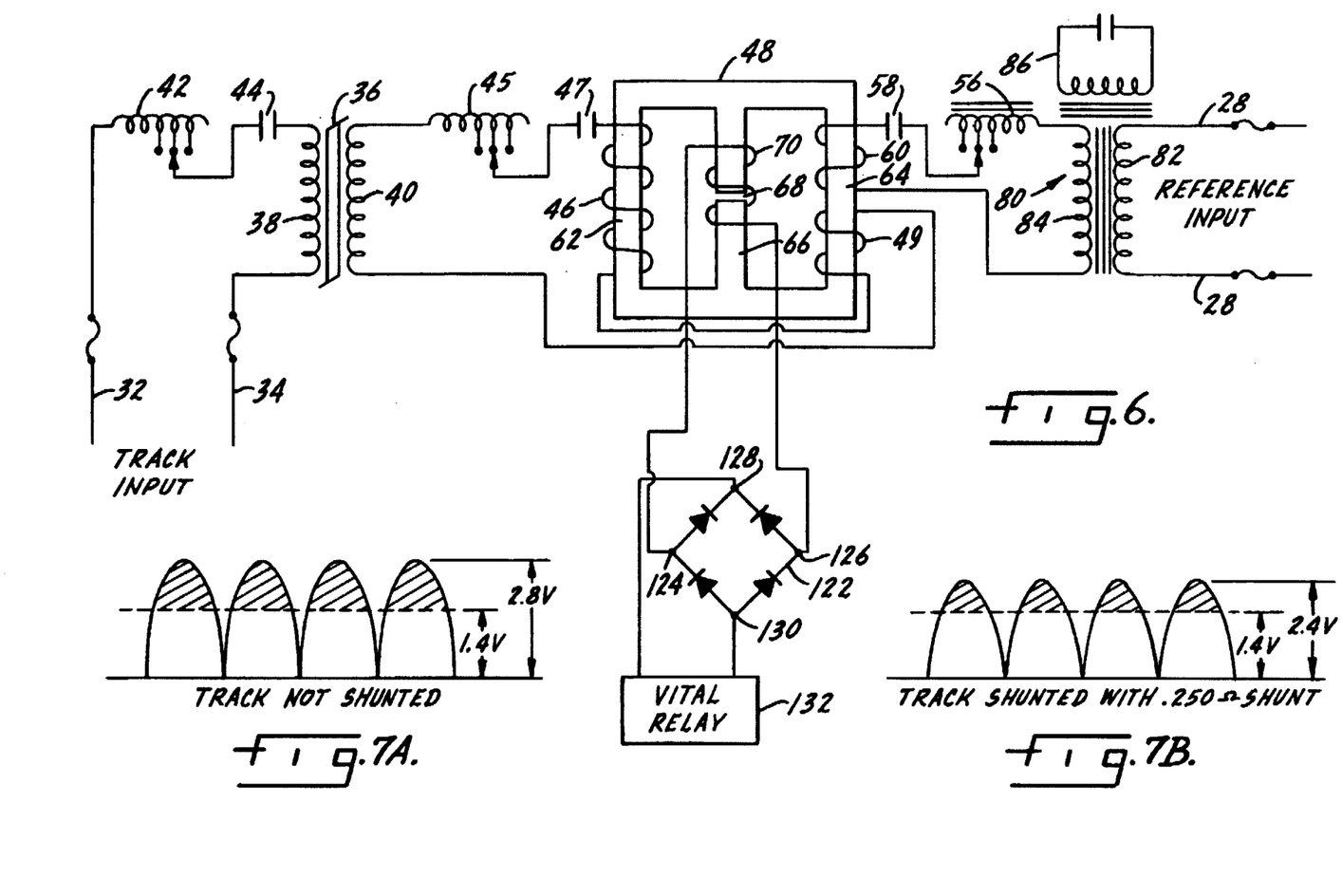
FIG. 6 is a schematic illustrating a fifth embodiment of the invention.
FIGS. 7A and 7B are waveform diagrams illustrating the track circuit output of the FIG. 6 embodiment when the track is not shunted and when it is shunted.

When the vital relay operates at a substantially lower voltage, for example a two ohm vital relay, the ratio enhancement performed by the non-linear element connected between the phase comparator and the vital relay may take on a substantially different form. The concept is the same and that is that there must be an enhancement of the ratio of the track unoccupied to track occupied voltage levels from the phase comparator. FIGS. 5 and 6 show essentially the same type of non-linear element which is in the form of a bridge rectifier using four silicon diodes. In the FIG. 5 embodiment, the output from the phase comparator or gate 48 is connected to a step-down transformer 120, whereas, in the FIG. 6 embodiment the number of coils on the output arm of gate 48 have been reduced to provide the same lower level output voltage as would be taken from the secondary side of step-down transformer 120. In each instance the output of the phase comparator, whether it be through the step-down transformer 120 or through reduced coils on the output arm of gate 48, is connected to a bridge rectifier 122. The input terminals for the bridge rectifier are indicated at 124 and 126. The output terminals 128 and 130 are connected to a vital relay 132 which in this embodiment of the invention may be a two ohm vital relay, although this particular size of the relay is only illustrative.

Silicon diodes have a constant forward voltage drop of 0.7 volts or 1.4 volts for two diodes in series as is the case with a four diode bridge rectifier as shown in FIGS. 5 and 6. Assuming for purposes of illustration that the track voltage to the phase comparator, when there is no shunt on the track, i.e. the track is unoccupied, is 1.0 volts AC and the track shunted voltage to the phase comparator or gate 48 is 0.42 volts AC, this provides a ratio of track unoccupied to track occupied voltage levels to the phase comparator of 1 to 0.42. Using input levels of this magnitude, the voltage output from the phase comparator will be 2.8 volts AC when the track is unoccupied and 2.4 volts AC when the track is occupied. Thus, the ratio of the output voltages from the phase comparator or gate 48 is 1 to 0.86. This is a substantially reduced ratio and one which is not sufficient to insure that the vital relay will not be operated when the track is occupied.

The bridge rectifier 122, functioning as a non-linear element with voltages of this magnitude, will enhance this ratio. Using silicon diodes having a forward voltage drop of 0.7 volts per diode, the voltage to the vital relay 132 when the track is unoccupied is 0.455 volts DC and the voltage to the vital relay when the track is occupied is 0.255 volts DC. This provides a ratio of 1 to 0.56. The pickup voltage for a two ohm track relay is 0.335 volts DC and the drop-away voltage is 0.275 volts DC. Thus, using the bridge rectifier as a non-linear element to enhance the ratio of voltage levels when the track is unoccupied vs. when it is occupied, provides the required assurance that the vital relay will pick up when the track is not occupied or not shunted and will drop away when the track is shunted with a 0.250 ohm shunt. In this connection, typically in electrified railroads, the industry standard is for a 0.25 ohm shunt rather than for a true zero ohm shunt as a train would provide.

FIGS. 7A and 7B illustrate the enhancement of the ratio of the phase comparator output voltage when the track is unoccupied vs. when the track is occupied. FIG. 7A illustrates the output of the bridge rectifier 122 when the track is not shunted with the shaded area representing the integrated value of the conducting portion of the sine wave applied to the bridge circuit. FIG. 7B represents the bridge diode output when the track is shunted with a 0.25 ohm shunt. Again, the shaded area represents the integrated value of the conducting portion of the sine wave. Thus, with a small change in the AC input voltage to the bridge rectifier there is a considerably greater change in the direct current drive to the vital relay. Thus, the ratio of the track unoccupied voltage to the track occupied voltage is substantially enhanced by the use of a bridge rectifier when the voltages at the output of the phase comparator are at the described levels.

Whereas the preferred form of the invention has been shown and described herein, it should be realized that there may be many modifications, substitutions and alterations thereto.

The embodiments of the invention in which an exclusive property or privilege is claimed are defined as follows:

1. A railroad vital relay control circuit including,
    a first input for receiving a reference alternating current signal of a selected frequency,
    a second input for receiving a track alternating current signal having the selected frequency of the reference signal and a predetermined phase and magnitude relationship therewith,
    a magnetic core having two input arms and an intermediate output arm, a first input winding on a first input arm and a second input winding on a second input arm, an output winding on said output arm,
    a frequency tuned voltage limiting ferroresonant transformer connecting said first input and said first input winding,
    said second input including a saturable transformer with the secondary winding thereof being connected to the second input winding of said magnetic core,
    said output winding being connected to a vital relay, said first and second input windings being connected to produce flux in the same direction in said output arm, in phase signals of the selected frequency at said magnetic core input windings providing sufficient flux in said output arm to induce a signal in the output winding to hold the vital relay in an operated position.

2. The control circuit of claim 1 including a non-linear circuit element connected in circuit between said vital relay and the output winding of said magnetic core.

3. The control circuit of claim 2 wherein said non-linear element includes a second magnetic core having two input arms and an output arm, a winding about each arm of said second magnetic core, one input winding of said second magnetic core being connected to the output winding of said first named magnetic core, with the output winding of said second magnetic core being connected to said vital relay.

4. The control circuit of claim 3 wherein there is a bridge circuit between the second magnetic core output winding and said vital relay.

5. The control circuit of claim 3 wherein the other input winding of said second magnetic core is connected to the output winding of said first-named magnetic core.

6. The control circuit of claim 5 including a rectifier circuit connected between the output winding of said first named magnetic core and said other input winding of said second magnetic core.

7. The control circuit of claim 3 wherein said second magnetic core has three parallel arms, an intermediate arm and two outside arms, said output winding of said second magnetic core being positioned about an outside arm.

8. The control circuit of claim 7 wherein said intermediate arm includes a permanent magnet associated therewith.

9. The control circuit of claim 8 including a rectifier connected between said vital relay and said second magnetic core output winding.

10. The control circuit of claim 1 including an additional input winding on said first input arm, said additional input winding being connected in circuit with the second input winding on the second input arm.

11. The control circuit of claim 1 including a step-down transformer connected between said output winding and said vital relay.

12. The control circuit of claim 11 including a bridge rectifier connected between said step-down transformer and vital relay.

13. The control circuit of claim 1 including a bridge rectifier connected between said vital relay and the output winding of said magnetic core.

14. The control circuit of claim 1 including tuning circuit means connected in circuit with the primary winding of said saturable transformer.

15. A railroad vital relay control circuit including,
    a first input for receiving a reference alternating current signal of a selected frequency,
    a second input for receiving a track alternating current signal having the selected frequency of the reference signal and a predetermined phase and magnitude relationship therewith,
    said first input signal being connected to a primary winding of a first transformer, said second input signal being connected to a primary winding of a second transformer, a first magnetic core having two input arms and an intermediate output arm, a first input winding on a first of said input arms, said first input winding being connected to a secondary of said first transformer, a second input winding on a second of said input arms, said second input winding being connected to the secondary of said second transformer, an output winding on said output arm, a second magnetic core having two input arms and an output arm, a winding about each arm of said second magnetic core, one input winding of said second magnetic core being connected to the output winding of said first magnetic core, the output winding of said second magnetic core being connected to a vital relay, the first and second input windings of said first magnetic core being connected to produce flux in the same direction in the output arm of said first magnetic core, in phase signals of the selected frequency at said first magnetic core input windings providing sufficient flux in the output arm of said first magnetic core to induce a signal in the output winding on the output arm of said first magnetic core to hold the vital relay in an operated position.

16. The control circuit of claim 15 wherein the other input winding of said second magnetic core is connected to the output winding of said first magnetic core.

17. The control circuit of claim 16 including a rectifier connected between the output winding of said first magnetic core and said other input winding of said second magnetic core.

18. The control circuit of claim 17 wherein said second magnetic core has three parallel arms, an intermediate arm and two outside arms, said output winding of said second magnetic core being positioned on an outside arm.

19. The control circuit of claim 18 wherein said intermediate arm of said second magnetic core includes a permanent magnet associated therewith.

20. The control circuit of claim 15 including a rectifier connected between said vital relay and the output winding of said second magnetic core.

21. The control circuit of claim 15 including tuning circuit means connected in circuit with the primary winding of said second transformer.

22. The control circuit of claim 15 including tuning circuit means connected in circuit with said first magnetic core first input winding and said first transformer secondary.

23. The control circuit of claim 15 wherein the output arm of said first magnetic core has an air gap.

24. A railroad vital relay control circuit including phase comparison means having a first input for receiving a reference alternating current signal of a selected frequency, a second input for said phase comparison means for receiving a track alternating current signal having the selected frequency of the reference signal and a predetermined phase and magnitude relationship therewith, said phase comparison means having an output, said phase comparison means providing a first output voltage level when the reference alternating current signal and track alternating current signal are in phase and a second lower output voltage level when said reference alternating current signal and said track alternating current signal are not in phase, a non-linear element for increasing the ratio of phase comparison means output voltages including a bridge rectifier having four diodes, two terminals of said bridge rectifier being connected to said phase comparison means output, a vital relay connected to two other terminals of said bridge rectifier, said diodes having a constant forward voltage drop, which constant forward voltage drop increases the ratio of the first in-phase output voltage level to the second out-of-phase voltage output level when said voltage levels are applied from the bridge rectifier to the vital relay.

25. The control circuit of claim 24 including a step-down transformer connected between the output of said phase comparison means and said two terminals of said bridge rectifier.

26. The control circuit of claim 24 wherein said diodes are silicon diodes.

* * * * *